United States Patent
Chen et al.

(10) Patent No.: US 12,207,449 B2
(45) Date of Patent: Jan. 21, 2025

(54) COOLING APPARATUS FOR SERVER

(71) Applicant: SUPER MICRO COMPUTER, INC., San Jose, CA (US)

(72) Inventors: Chia-Wei Chen, NewTaipei (TW); Te-Chang Lin, San Jose, CA (US); Yueh-Ming Liu, NewTaipei (TW); Yu-Hsiang Huang, New Taipei (TW); Ya-Lin Liu, New Taipei (TW); Chi-Che Chang, Taoyuan (TW)

(73) Assignee: Super Micro Computer, Inc., San Jose, CA (US)

( * ) Notice: Subject to any disclaimer, the term of this patent is extended or adjusted under 35 U.S.C. 154(b) by 373 days.

(21) Appl. No.: 17/713,378

(22) Filed: Apr. 5, 2022

(65) Prior Publication Data
US 2023/0320040 A1 Oct. 5, 2023

(51) Int. Cl.
*H05K 7/20* (2006.01)

(52) U.S. Cl.
CPC ..... *H05K 7/20781* (2013.01); *H05K 7/20272* (2013.01)

(58) Field of Classification Search
CPC ........... H05K 7/20781; H05K 7/20272; H05K 7/20763; Y02D 10/00; G06F 1/20; F04B 19/00; F04B 53/22; F04D 29/00; F04D 29/026
USPC ...................................................... 165/80.4
See application file for complete search history.

(56) References Cited

U.S. PATENT DOCUMENTS

| | | | | |
|---|---|---|---|---|
| 7,484,552 B2* | 2/2009 | Pfahnl | ................. | F28D 1/0535 |
| | | | | 165/80.4 |
| 7,486,513 B2* | 2/2009 | Hall | ..................... | G06F 1/20 |
| | | | | 165/80.4 |
| 7,639,499 B1* | 12/2009 | Campbell | ......... | H05K 7/20772 |
| | | | | 165/104.19 |
| 7,929,305 B1* | 4/2011 | Pal | ................... | H05K 7/20645 |
| | | | | 174/15.1 |
| 7,961,465 B2* | 6/2011 | Goldrian | ......... | H05K 7/20772 |
| | | | | 165/80.4 |
| 9,215,832 B2* | 12/2015 | Chang | ............... | H05K 7/20636 |

(Continued)

FOREIGN PATENT DOCUMENTS

| | | |
|---|---|---|
| TW | M587771 U | 12/2019 |
| TW | 1738571 | 9/2021 |
| TW | 202210716 | 3/2022 |

*Primary Examiner* — Len Tran
*Assistant Examiner* — Gustavo A Hincapie Serna
(74) *Attorney, Agent, or Firm* — Beyer Law Group LLP

(57) ABSTRACT

A cooling apparatus is provided. An external cooling fluid flows into an external inlet opening from an external inlet pipe and passes through a heat exchanger to flow out of an external outlet opening to an external outlet pipe. An internal cooling fluid flows into an internal inlet pipe from the server and flows into an internal inlet opening from the internal inlet pipe and passes through the heat exchanger for heat exchange with the external cooling fluid to flow out of an internal outlet opening to an internal outlet pipe. A hot-swap pump has a pump main body, an inlet anti-leakage pipe, an outlet anti-leakage pipe and a hot-swap connector. The inlet anti-leakage pipe includes an inlet connector and an inlet anti-leakage valve. The outlet anti-leakage pipe includes an outlet connector and an outlet anti-leakage valve. The hot-swap connector is electrically connected to the pump main body.

11 Claims, 11 Drawing Sheets

(56) References Cited

U.S. PATENT DOCUMENTS

| | | | | |
|---|---|---|---|---|
| 9,575,521 | B1* | 2/2017 | North | H05K 7/20772 |
| 10,459,499 | B2* | 10/2019 | Shabbir | H05K 7/20772 |
| 10,617,042 | B2* | 4/2020 | Shelnutt | H05K 7/20772 |
| 11,310,939 | B2* | 4/2022 | Ye | H05K 7/20272 |
| 11,395,443 | B2* | 7/2022 | Varela Benitez | G06F 1/20 |
| 12,013,732 | B2* | 6/2024 | Carver | H05K 7/20272 |
| 2009/0218072 | A1* | 9/2009 | Eriksen | G06F 1/20 |
| | | | | 165/80.2 |
| 2010/0101765 | A1* | 4/2010 | Campbell | H05K 7/20809 |
| | | | | 361/699 |
| 2014/0262180 | A1* | 9/2014 | Lyon | F28F 9/02 |
| | | | | 165/173 |
| 2018/0279510 | A1* | 9/2018 | Johnson | H05K 7/20772 |
| 2019/0178592 | A1* | 6/2019 | Chen | F28F 27/02 |
| 2019/0182988 | A1* | 6/2019 | Lunsman | H05K 7/20281 |
| 2019/0337355 | A1* | 11/2019 | Shah | B60H 1/3229 |
| 2020/0053916 | A1* | 2/2020 | Bonnin | H05K 7/20781 |
| 2020/0107470 | A1* | 4/2020 | Archer | G06F 1/20 |
| 2021/0274680 | A1* | 9/2021 | Ye | H05K 7/20781 |
| 2021/0352830 | A1* | 11/2021 | Varela Benitez | H05K 7/20272 |
| 2022/0248570 | A1* | 8/2022 | Chen | H05K 7/20272 |
| 2023/0180431 | A1* | 6/2023 | Archibald | G05D 23/1917 |
| | | | | 361/701 |

\* cited by examiner

COOLING APPARATUS FOR SERVER

BACKGROUND

Technical Field

The technical field of the present disclosure relates to a cooling apparatus, and in particular, to a cooling apparatus for a server.

Description of Related Art

Server systems are known to generate heat during operation, and the installation of cooling apparatus in server systems to ensure stable operation of the systems is a common cooling solution. However, as technology advances, heat generated by electronic components also becomes higher. Accordingly, liquid-cooling apparatus of higher cooling efficiency is one of the design choices for electronic component cooling.

In addition, related-art liquid-cooling apparatus for servers typically includes the elements of pump, heat sink and fan to achieve cooling of heat-generating components. Nevertheless, since a server system is typically under continuous operation for a long period of time, in case where a pump of the cooling apparatus fails or requires repair, the entire cooling apparatus may need to be suspended or shut down and that may lead to operational risks of the server. Furthermore, most of the cooling apparatus of servers require the use of tools for installation, and their assembly operations are relatively difficult and inconvenient. Moreover, the pump quantity cannot be adjusted or the replacement cannot be made according to the actual needs, such that the flexibility of such cooling apparatus is reduced.

In view of the above, the inventor seeks to overcome the aforementioned drawbacks associated with the current technology and aims to provide an effective solution through extensive researches along with utilization of academic principles and knowledge.

SUMMARY

An objective of the present disclosure is to provide a cooling apparatus for a server, and the cooling apparatus includes a hot-swap pump, an inlet anti-leakage pipe and an outlet anti-leakage pipe, such that when the pump is connected in a hot-swap manner, it may prevent leakage of the cooling fluid, thereby increasing the flexibility and convenience of the cooling apparatus during installation and assembly.

To achieve the aforementioned objective, the present disclosure provides a cooling apparatus for a server, including a heat exchanger, an external cooling loop, an internal cooling loop and a first hot-swap pump. The heat exchanger includes an external inlet opening, an external outlet opening, an internal inlet opening and an internal outlet opening. The external cooling loop includes an external inlet pipe and an external outlet pipe. An external cooling fluid flows into the external inlet opening from the external inlet pipe and passes through the heat exchanger to further flow out of the external outlet opening to the external outlet pipe. The internal cooling loop includes an internal inlet pipe and internal outlet pipe. An internal cooling fluid flows into the internal inlet pipe from the server and further flows into the internal inlet opening from the internal inlet pipe and passes through the heat exchanger to perform heat exchange with the external cooling fluid to flow out of the internal outlet opening to the internal outlet pipe. The first hot-swap pump includes a first pump main body, a first inlet anti-leakage pipe, a first outlet anti-leakage pipe and a first hot-swap connector. The first inlet anti-leakage pipe and the first outlet anti-leakage pipe communicate with the first pump main body. The first inlet anti-leakage pipe includes a first inlet connector and a first inlet anti-leakage valve arranged in the first inlet connector. The first outlet anti-leakage pipe includes a first outlet connector and a first outlet anti-leakage valve arranged in the first outlet connector. The first hot-swap connector is electrically connected to the first pump main body. The internal cooling fluid flows out of the internal outlet opening and flows into the first inlet connector and passes through the first inlet anti-leakage valve to enter the first pump main body. The internal cooling fluid flows out of the first pump main body and flows into the first outlet connector and further passes through the first outlet anti-leakage valve to enter the server.

In comparison with related art, the cooling apparatus for a server of the present disclosure includes a hot-swap pump, an inlet anti-leakage pipe and an outlet anti-leakage pipe, such that during the removal and insertion processes of the swappable pump, it may prevent leakage of the cooling fluid, and the use of tools required for installation of pumps in related-art cooling apparatus may be eliminated, thereby increasing the assembly convenience for users. Furthermore, the cooling apparatus of the present disclosure utilizes a hot-swap pump such that the pump quantity may be adjusted or replaced according to the actual needs, thereby increasing the flexibility of actual use of the cooling apparatus and improving the practicality.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
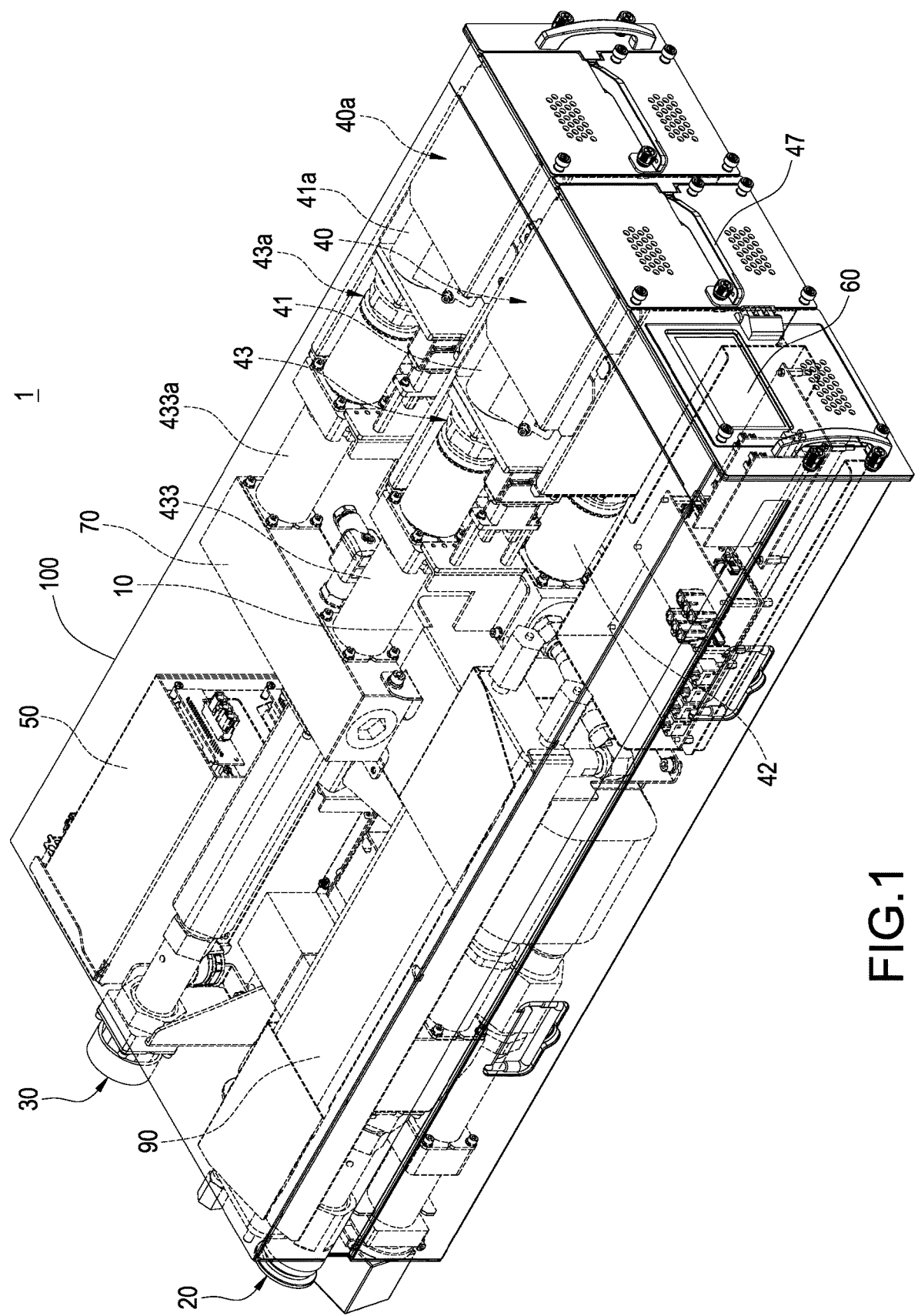
FIG. 1 is a perspective view of the cooling apparatus for a server of the present disclosure viewed from one direction.
Figure 2:
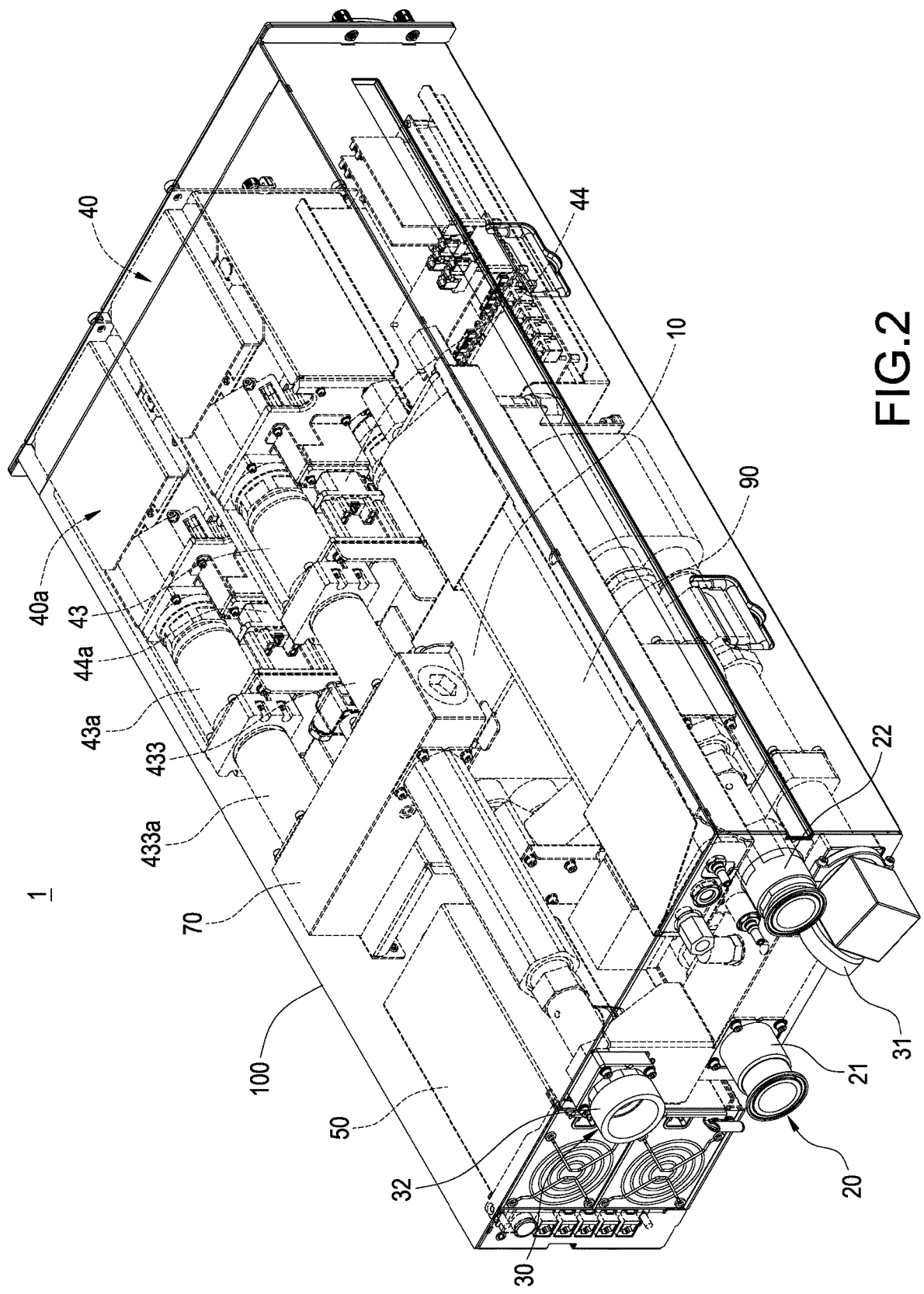
FIG. 2 is another perspective view of the cooling apparatus for a server of the present disclosure viewed from another direction.

FIG. 1 and FIG. 2 are perspective views of the cooling apparatus for a server of the present disclosure viewed from two side directions. The present disclosure provides a cooling apparatus 1 for a server. The cooling apparatus 1 includes a heat exchanger 10, an external cooling loop 20, an internal cooling loop 30, a first hot-swap pump 40 and a chassis 100. The heat exchanger 10 and the first hot-swap pump 40 are arranged inside the chassis 100. The external cooling loop 20 and the internal cooling loop 30 are connected to the heat exchanger 10 respectively, and perform heat exchange via the heat exchanger 10. In addition, the first hot-swap pump 40 is arranged inside the internal cooling loop 30 to increase the hydraulic pressure inside the internal cooling loop 30. The internal loop 30 is used to cool a server system (not shown in the drawings).

In an exemplary embodiment of the present disclosure, the cooling apparatus 1 further includes a power supply 50 and a control panel 60. The power supply 50 provides the electrical power necessary for the operation of the cooling apparatus 1. The control panel 60 is electrically connected to the first hot-swap pump 40 and is used to control the operation of the cooling apparatus 1.

Figure 3:
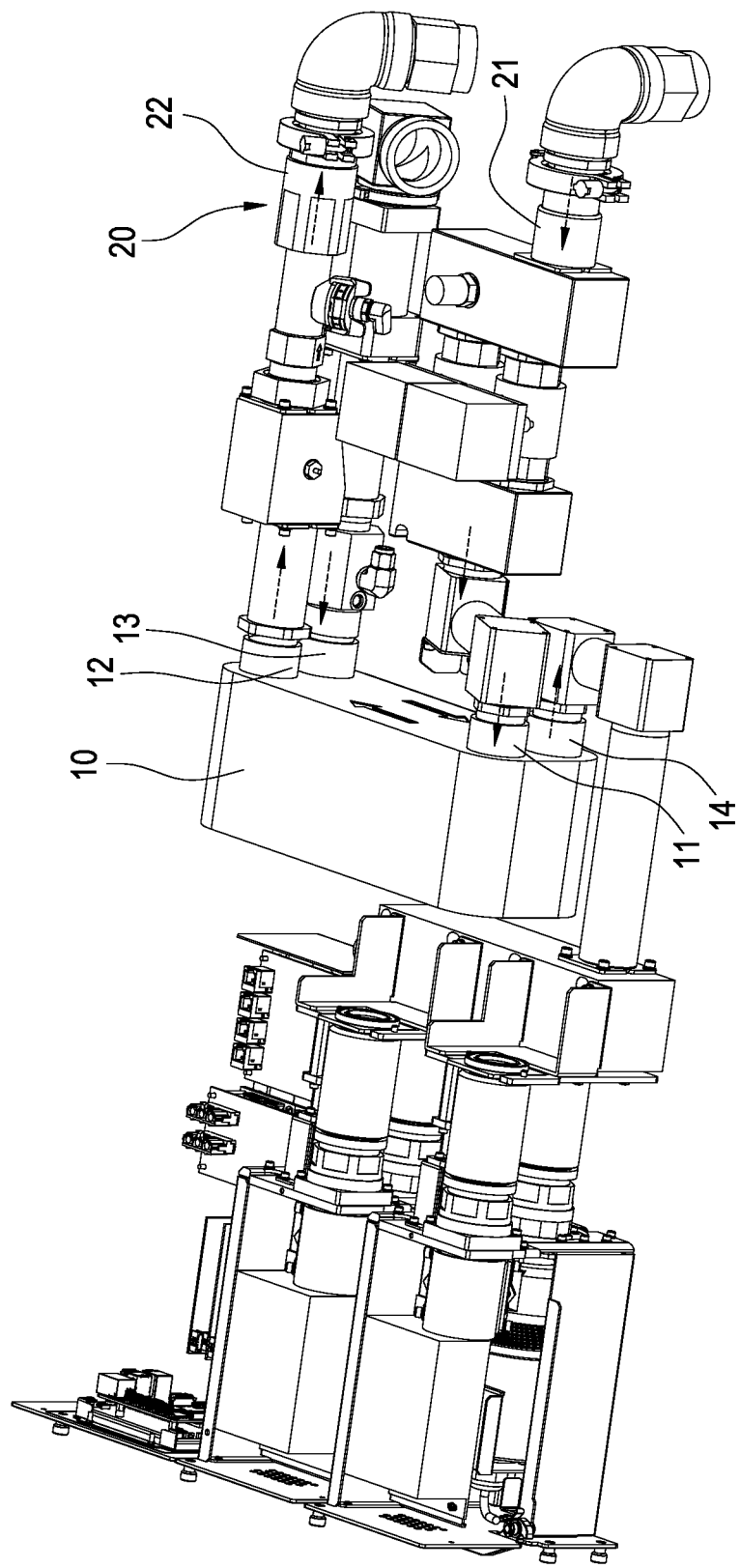
FIG. 3 is an illustration showing the arrangement of the external cooling loop of the present disclosure.
Figure 4:
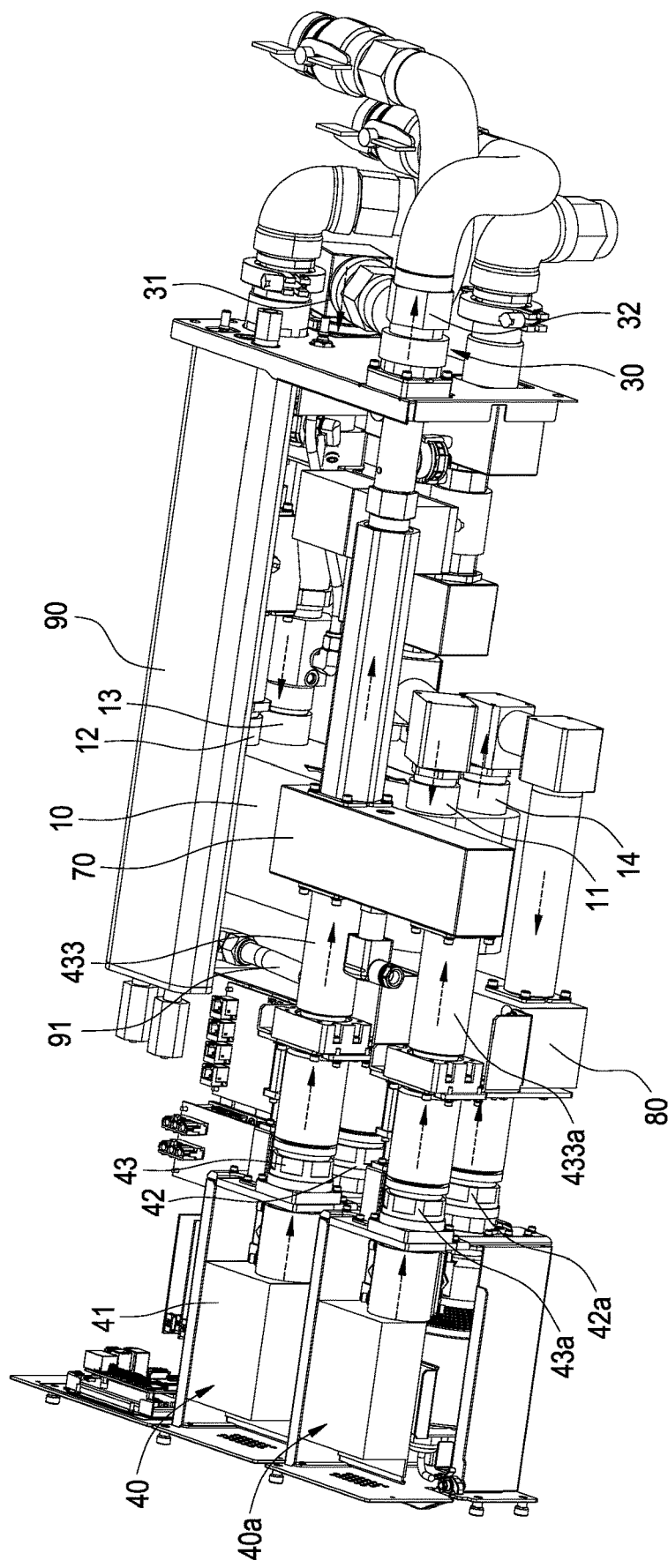
FIG. 4 is a schematic view showing the arrangement of the internal cooling loop of the present disclosure.

Please refer to FIG. 3 and FIG. 4, showing schematic views of the arrangement of the external cooling loop and the internal cooling loop and of the present disclosure respectively. The heat exchanger 10 is a plate type heat exchanger capable of transmitting heat in a hot fluid to a cold fluid. In addition, the heat exchanger 10 includes an external inlet opening 11, an external outlet opening 12, an internal inlet opening 13 and an internal outlet opening 14.

As shown in FIG. 3, the external cooling loop 20 includes an external inlet pipe 21 and an external outlet pipe 22. Furthermore, an external cooling fluid flows from the external inlet pipe 21 into the external inlet opening 11 and passes through the heat exchanger 10 to further flow out of the external outlet opening 12 to the external outlet pipe 22. Accordingly, the external cooling fluid may perform heat exchange with the hot fluid in another loop inside the heat exchanger 10 to remove the heat.

During the actual use, the external inlet pipe 21 and the external outlet pipe 22 are connected to an external fluid container (not shown in the drawings), such as a container of water tower. The external fluid container contains a cooling fluid for providing the cooling liquid necessary for the heat exchanger 10 to perform heat exchange. In addition, the external inlet pipe 21 is connected to the external inlet opening 11 of the heat exchanger 10. Furthermore, the external outlet pipe 22 is connected to the external outlet opening 12 of the heat exchanger 10.

As shown in FIG. 4, the internal cooling loop 30 includes an internal inlet pipe 31 and an internal outlet pipe 32. In addition, an internal cooling fluid flows from the external server into the internal inlet pipe 31 and further flows into the internal inlet opening 13 from the internal inlet pipe 31 and passes through the heat exchanger 10 to perform heat exchange with the external cooling fluid to flow out of the internal outlet opening 14 to the internal outlet pipe 32. It shall be noted that the internal cooling fluid flowing out of the internal outlet opening 14 is under the pressurization effect from the first hot-swap pump 40 to flow into the internal outlet pipe 32, which is explained in detail in the following content.

In addition, it shall also be noted that during the actual use of the cooling apparatus 1 of the present disclosure, the internal outlet pipe 32 is connected to the cooling fluid input end of the server system, and absorbs the heat generated by the internal heat-generating elements inside the server system. Moreover, as the cooling fluid carries away the heat, its temperature is increased to become a hot fluid. Finally, it further flows into the internal inlet pipe 31, and enters the internal cooling loop 30 of the present disclosure, and the cooling cycle is complete.

Figure 5:
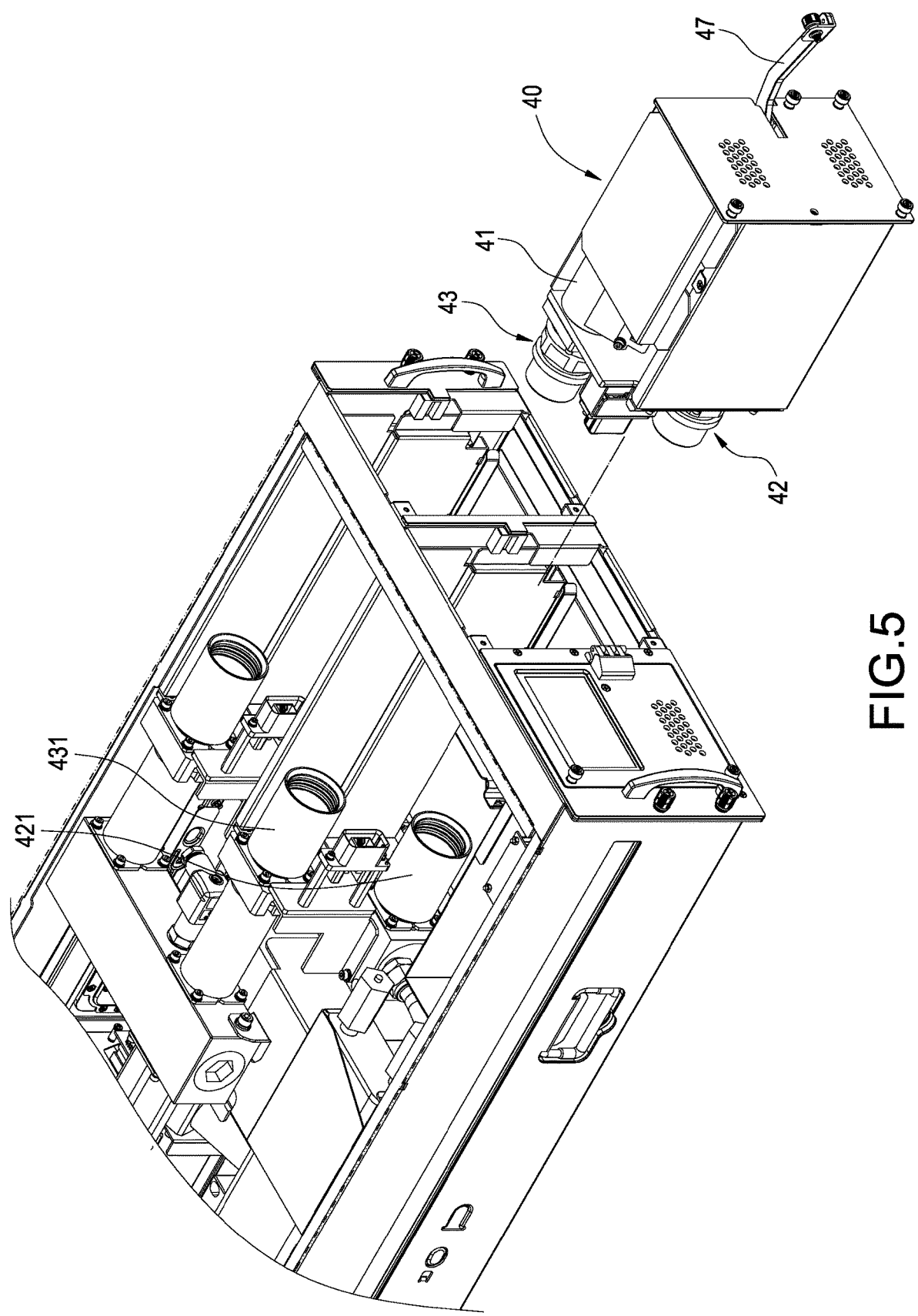
FIG. 5 is a schematic view showing the insertion of the first hot-swap pump of the present disclosure.
Figure 6:
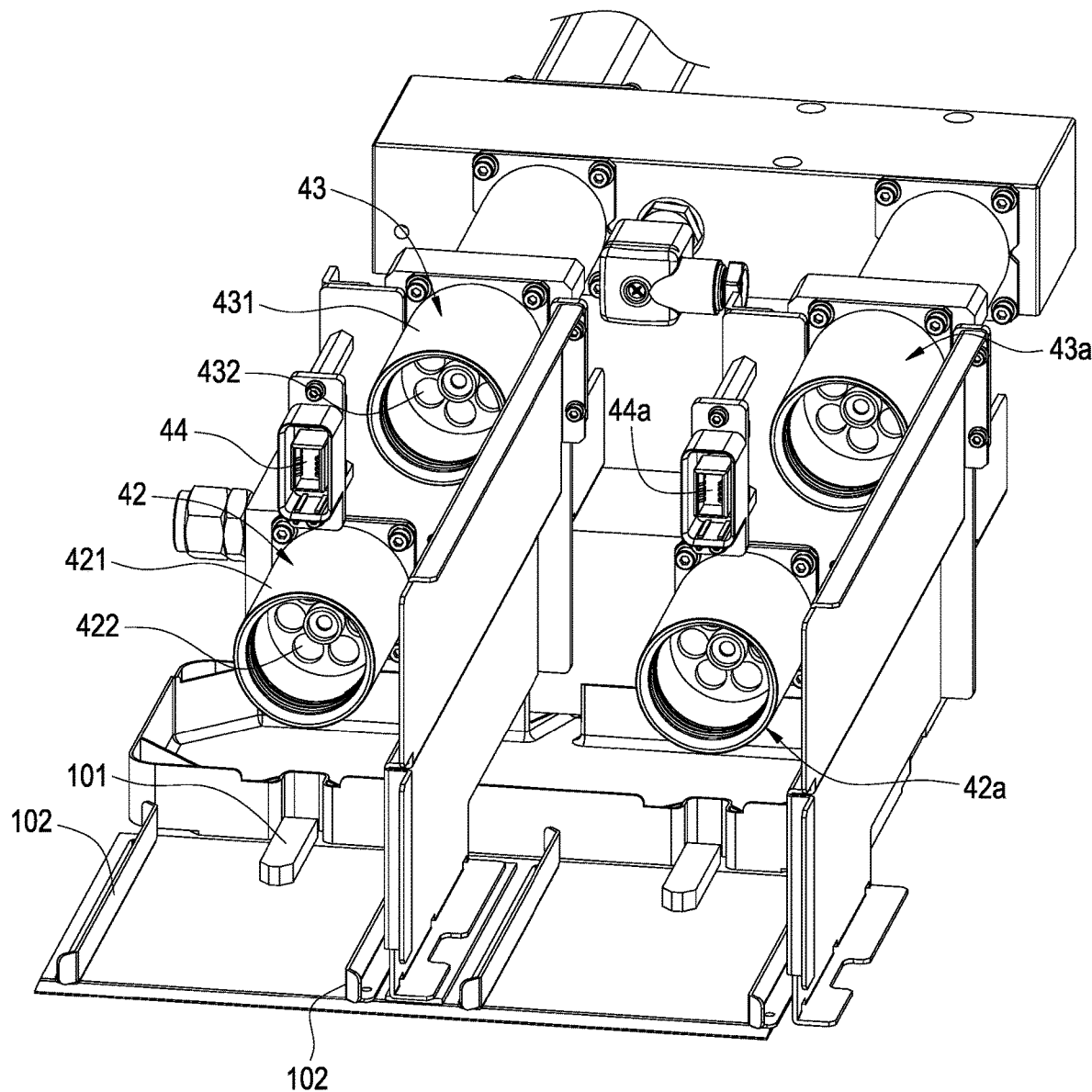
FIG. 6 is a partial appearance view of the first inlet anti-leakage pipe and the first outlet anti-leakage pipe of the present disclosure.
Figure 7:
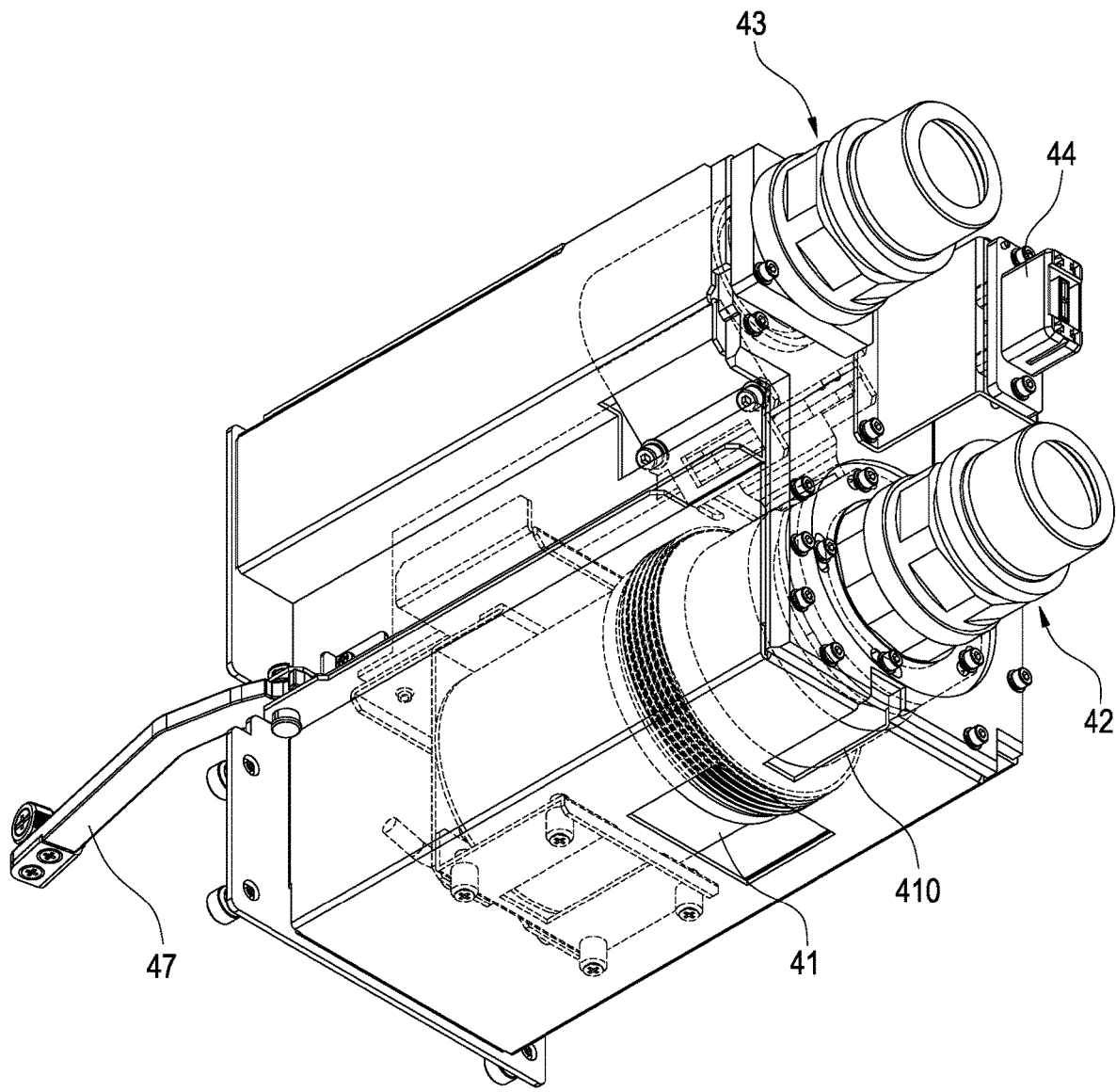
FIG. 7 is a perspective appearance view of the first hot-swap pump of the present disclosure viewed from another direction.

Please refer to FIG. 5 to FIG. 7, respectively showing a schematic view of the insertion of the first hot-swap pump of the present disclosure, a partial appearance view of the first inlet anti-leakage pipe and the first outlet anti-leakage pipe, and a perspective appearance view of the first hot-swap pump viewed from another direction. In an exemplary embodiment, the first hot-swap pump 40 includes a first pump main body 41, a first inlet anti-leakage pipe 42, a first outlet anti-leakage pipe 43 and a first hot-swap connector 44. The first inlet anti-leakage pipe 42 and the first outlet anti-leakage pipe 43 communicate with the first pump main body 41. The first pump main body 41 is electrically connected to the power supply 50. In addition, the first hot-swap connector 44 is electrically connected to the first pump main body 41. It shall be noted that the first hot-swap connector 44 includes male and female connectors arranged on the first pump main body 41 and the chassis 100. For concise presentation of the exemplary embodiment, the labels of the male and female connectors are omitted.

To be more specific, the first inlet anti-leakage pipe 42 includes a first inlet connector 421 and a first inlet anti-leakage valve 422 arranged inside the first inlet connector 421. Furthermore, the first outlet anti-leakage pipe 43 includes a first outlet connector 431 and a first outlet anti-leakage valve 432 arranged inside the first outlet connector 431.

Please also refer to FIG. 4. After the cooling fluid flows out of the internal outlet opening 14, it flows into the first inlet connector 421 of the first inlet anti-leakage pipe 42, and passes through the first inlet anti-leakage valve 422 to flow into the first pump main body 41. Next, the internal cooling fluid flows out of the first pump main body 41 and flows into the first outlet connector 431 and further passes through the first outlet anti-leakage valve 432 to enter the server system.

It shall be noted that the cooling device 1 may include single hot-swap pump or a plurality of hot-swap pumps. In an exemplary embodiment, the cooling apparatus 1 further includes a second hot-swap pump 40a, as shown in FIG. 3 and FIG. 4. The second hot-swap pump 40a is arranged in parallel with the first hot-swap pump 40. The second hot-swap pump 40a may be provided for backup use in case where operation of the first hot-swap pump 40 is ceased. In addition, the pressure of the second hot-swap pump 40a may be set to be different from the pressure of the first hot-swap pump 40 such that it may be used as an auxiliary pump.

Furthermore, as shown in FIG. 4 and FIG. 6, the second hot-swap pump 40a includes a second pump main body 41a, a second inlet anti-leakage pipe 42a, a second outlet anti-leakage pipe 43a and a second hot-swap connector 44a. The second inlet anti-leakage pipe 42a and the second outlet anti-leakage pipe 43a communicate with the second pump main body 41a, and the second pump main body 41a is electrically connected to the power supply 50. In addition, the second hot-swap connector 44a is electrically connected to the second pump main body 41a. It shall be noted that the structural design of the second hot-swap connector 44a may be substantially the same as that of the first hot-swap connector 44, for example, including the male and female connectors. Similarly, for concise presentation of the structure, labels of the male and female connectors are omitted.

In some embodiments, the first outlet anti-leakage pipe 43 includes a first outlet non-return valve 433. The second outlet anti-leakage pipe 43a includes a second outlet non-return valve 433a. In addition, when the pressure settings of the first hot-swap pump 40 and the second hot-swap pump 40a are different, the first outlet non-return valve 433 and the second outlet non-return valve 433a may prevent back flow of the fluid due to pressure difference.

In an exemplary embodiment, the cooling apparatus 1 includes the first hot-swap pump 40 and the second hot-swap pump 40a. In addition, the cooling apparatus 1 further includes a first branch pipe box 70 and a second branch pipe box 80. The first outlet anti-leakage pipe 43 and the second outlet anti-leakage pipe 43a are connected to the first branch pipe box 70, and the first branch pipe box 70 is connected to the internal outlet pipe 32. Furthermore, the first inlet anti-leakage pipe 42 and the second outlet anti-leakage pipe 42a are connected to the second branch pipe box 80, and the second branch pipe box 80 is connected to the internal outlet opening 14.

It shall be noted that the cooling apparatus 1 further includes a water tank 90 and a connecting pipe 91. The water tank 90 is connected to the second branch pipe box 80 via the connecting pipe. Accordingly, the water tank 90 may supply the cooling fluid inside the internal cooling loop 30.

Figure 8:
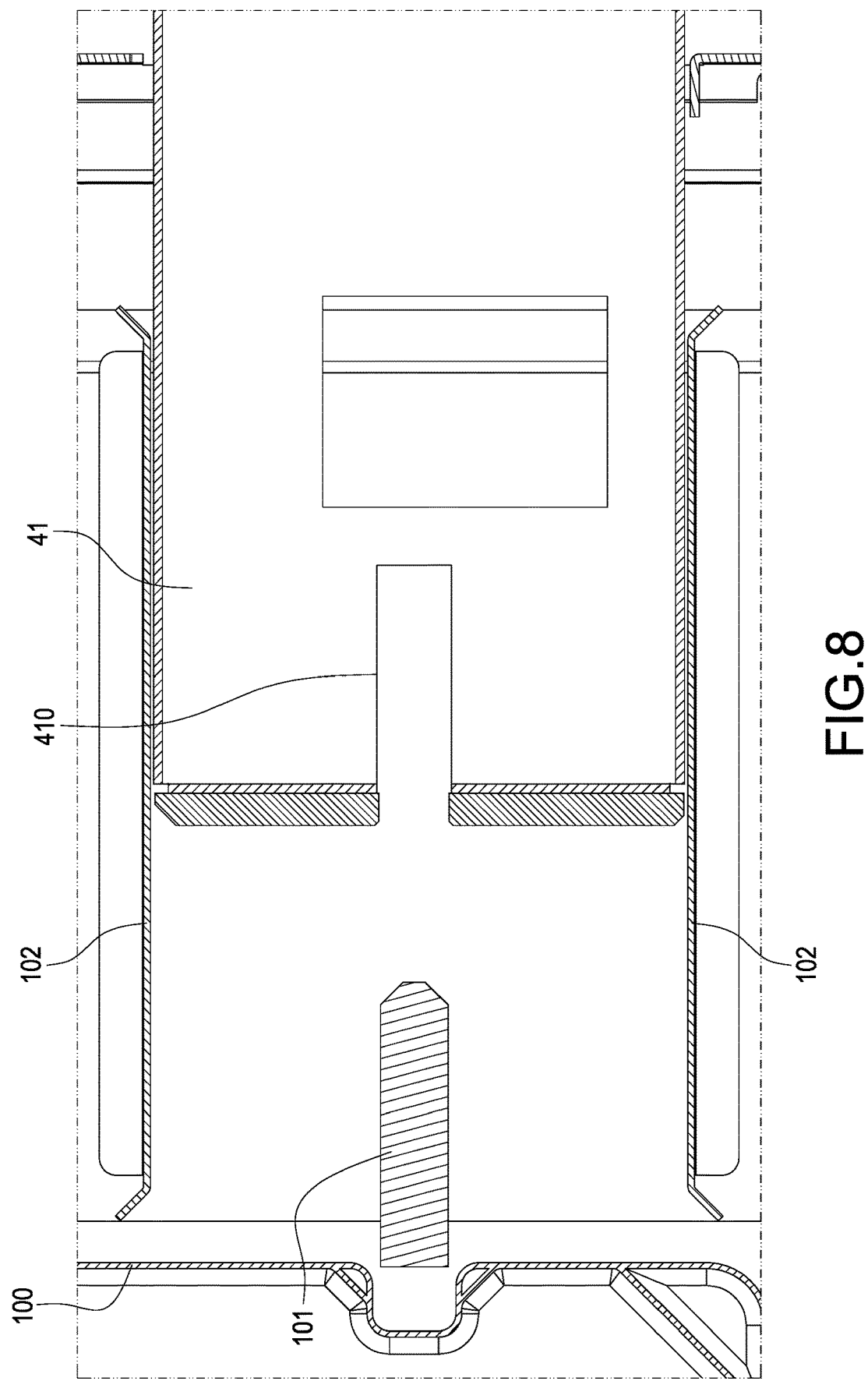
FIG. 8 is an assembly cross sectional view of the hot-swap pump of the present disclosure attached to the chassis.
Figure 9:
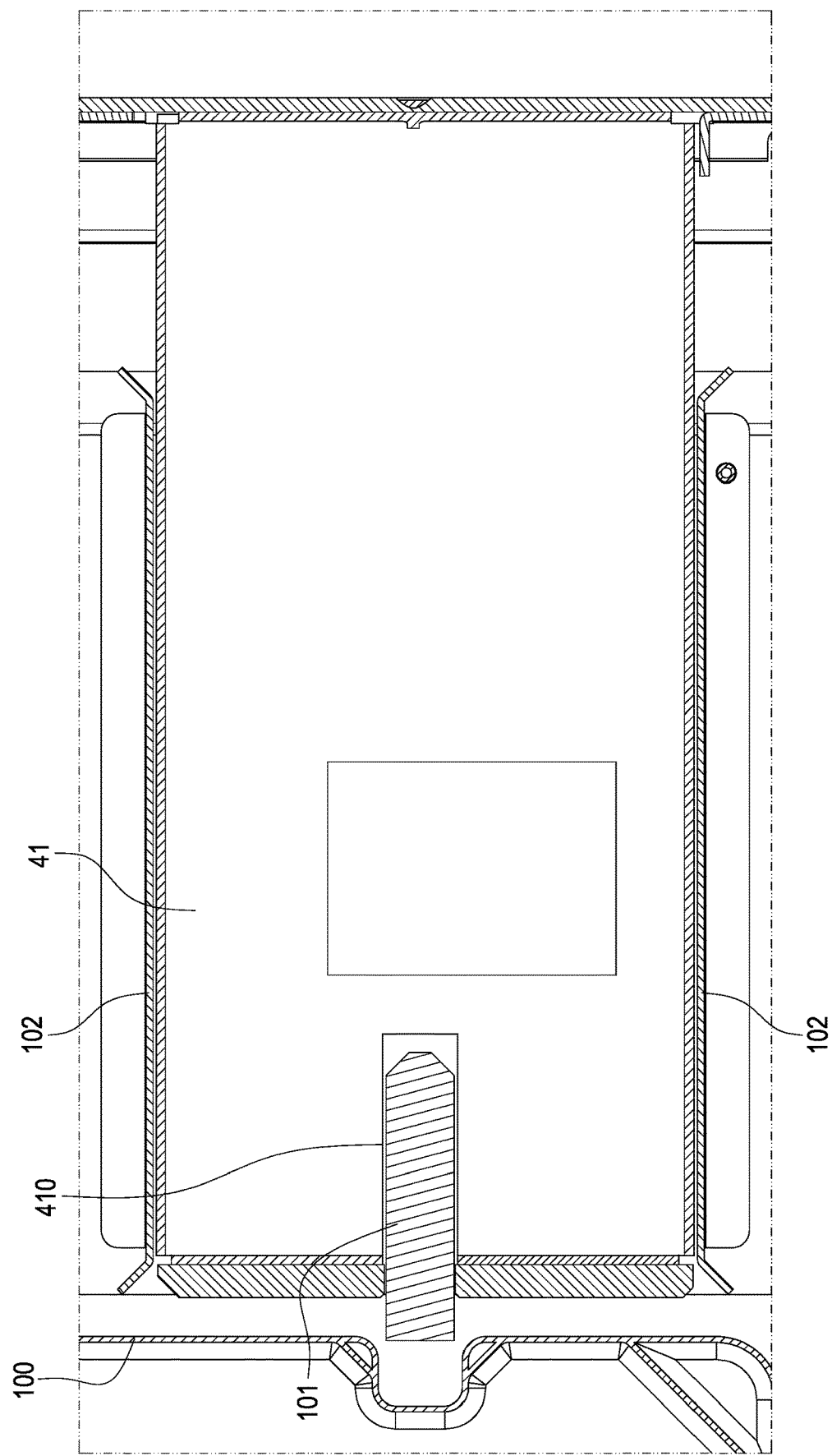
FIG. 9 is another assembly cross sectional view of the hot-swap pump of the present disclosure attached to the chassis.

Please refer to FIG. 8 and FIG. 9, showing assembly cross sectional views of the hot-swap pump of the present disclosure attached to the chassis. It shall be noted that the pump installed in the cooling apparatus of the present disclosure is a hot-swap type or hot-plug type of pump, and is also known as hot-swappable pump. Since the hot-swap pump is "swapped with electrical power" during its operation, it means that hot-swap pump may be detached or installed without the need of turning off the electronic equipment, and it is also able to prevent damages of its controller or peripheral equipment at the same time.

During the attachment of the hot-swap pump, it is necessary to consider the electrical and mechanical connections in order to prevent the occurrence of improper contact or water leakage. In view of the above, the cooling apparatus 1 of the present disclosure includes a positioning structure formed on the first hot-swap pump 40 and the chassis 100 respectively to facilitate the first hot-swap pump 40 being installed on the chassis 100 accurately.

To be more specific, the chassis 100 includes a guiding block 101 and a pair of guiding tracks 102. In addition, the first pump main body 41 includes a guiding slot 410 arranged corresponding to the guiding block 101 for positioning with each other. The first pump main body 41 enters the chassis 100 along the pair of guiding tracks 102 for engaging with the first inlet anti-leakage pipe 42 and the first outlet anti-leakage pipe 43. Accordingly, the first hot-swap pump 40 may achieve electrical connection with the cooling apparatus 1 via the hot-swap manner. Furthermore, the first inlet anti-leakage pipe 42 and the first outlet anti-leakage pipe 43 may prevent the occurrence of the cooling fluid leakage.

Figure 10:
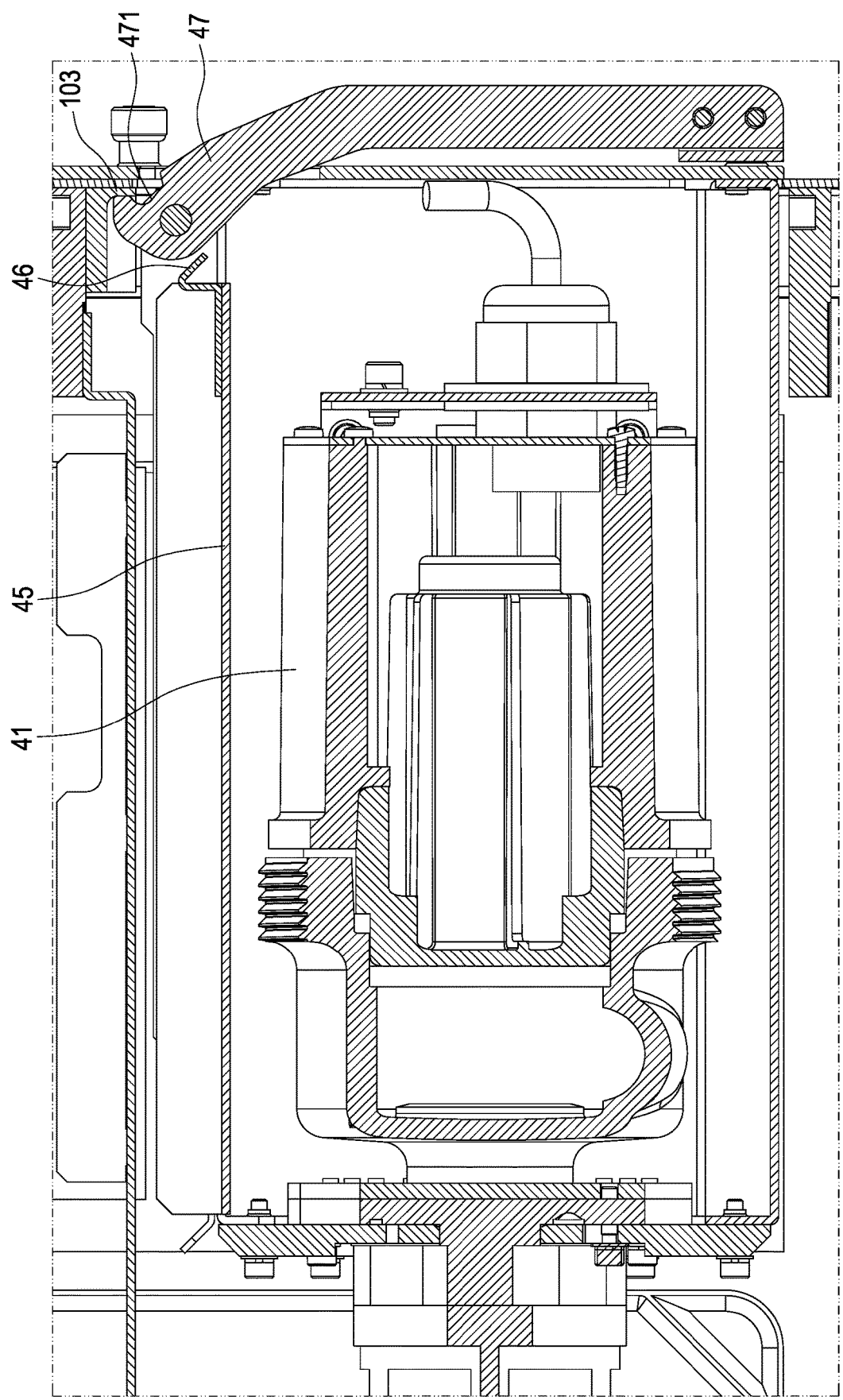
FIG. 10 is a cross sectional view showing the handle of the hot-swap pump of the present disclosure being folded downward.
Figure 11:
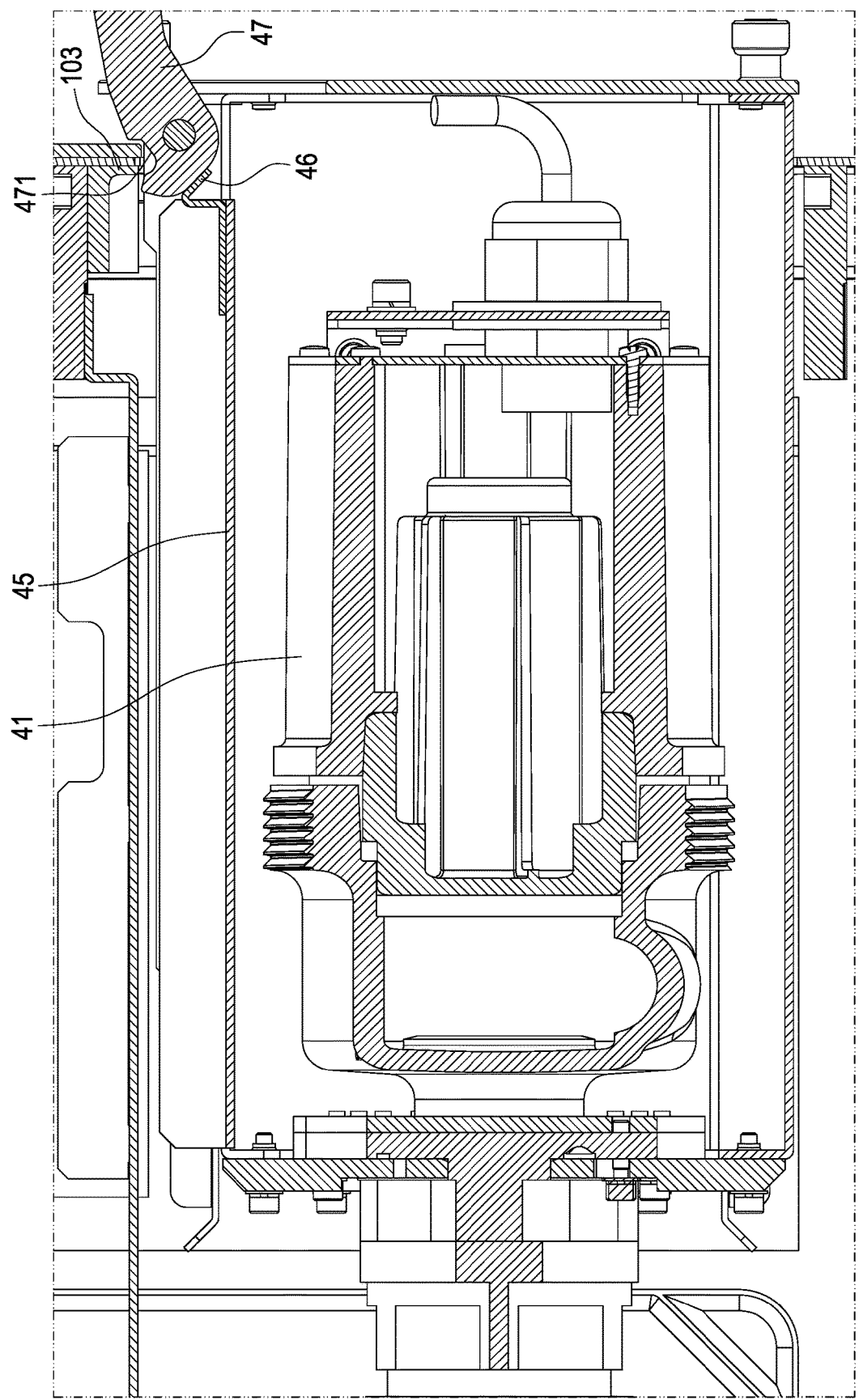
FIG. 11 is a cross sectional view showing the handle of the hot-swap pump of the present disclosure being rotated outward.

Please further refer to FIG. 10 and FIG. 11, showing cross sectional views of the handle of the hot-swap pump of the present disclosure being folded downward and rotated outward respectively. In an exemplary embodiment, the chassis 100 includes a protruding plate 103. In addition, the first hot-swap pump 40 further includes a first pump outer casing 45 for receiving the first pump main body 41, and the first pump outer casing 45 includes a press elastic slab 46 and is pivotally attached to a handle 47.

As shown in FIG. 10, the handle 47 includes a locking slot 471. Furthermore, the handle 47 is configured to be rotated outward and to be folded relative to the chassis 100. When the handle 47 is rotated outward, the press elastic slab 46 is pressed by the handle 47. When the handle 47 is folded at an outer side of the first pump outer casing 45, the locking slot 471 of the handle 47 is locked with the protruding plate 103 of the chassis 100.

As shown in FIG. 11, when the first hot-swap pump 40 is being detached from the chassis 100, it is necessary to disengage the locking between the locking slot 471 of the handle 47 and the protruding plate 103 of the chassis 100, following which the handle 47 is then rotated to reach the maximum angle. In addition, one end of the handle 47 presses the press elastic slab 46. As the press elastic slab 46 is pressed, it then drives the pump outer casing 45 to move outward. At the same time, the first inlet anti-leakage pipe 42, the first outlet anti-leakage pipe 43 and the first hot-swap connector 44 of the first hot-swap pump 40 are under the disengagement state, allowing the first hot-swap pump 40 to be detached from the chassis 100 for further operation, such as repair or replacement.

The above description is provided to illustrate the exemplary embodiments of the present disclosure only such that it shall not be treated as limitation to the claimed scope of the present disclosure. In addition, any equivalent modification made based on the present disclosure shall be considered to be within the claimed scope of the present disclosure.

What is claimed is:

1. A cooling apparatus for a server, the cooling apparatus comprising:
   a heat exchanger, comprising an external inlet opening, an external outlet opening, an internal inlet opening and an internal outlet opening;
   an external cooling loop, comprising an external inlet pipe and an external outlet pipe, wherein an external cooling fluid flows into the external inlet opening from the external inlet pipe, and passes through the heat exchanger to further flow out of the external outlet opening to the external outlet pipe;
   an internal cooling loop, comprising an internal inlet pipe and an internal outlet pipe, wherein an internal cooling fluid flows into the internal inlet pipe from the server, and further flows into the internal inlet opening from the internal inlet pipe, and passes through the heat exchanger to perform a heat exchange with the external cooling fluid to flow out of the internal outlet opening to the internal outlet pipe;
   a first hot-swap pump, comprising a first pump main body, a first inlet anti-leakage pipe, a first outlet anti-leakage pipe and a first hot-swap connector, wherein the first inlet anti-leakage pipe and the first outlet anti-leakage pipe communicate with the first pump main body, the first inlet anti-leakage pipe comprises a first inlet connector and a first inlet anti-leakage valve arranged in the first inlet connector, the first outlet anti-leakage pipe comprises a first outlet connector and a first outlet anti-leakage valve arranged in the first outlet connector, and the first hot-swap connector is electrically connected to the first pump main body; and
   wherein the internal cooling fluid flows out of the internal outlet opening and flows into the first inlet connector and further passes through the first inlet anti-leakage valve to enter the first pump main body, and the internal cooling fluid flows out of the first pump main body and flows into the first outlet connector and further passes through the first outlet anti-leakage valve to enter the server.

2. The cooling apparatus according to claim 1, further comprising: a power supply and a control panel that is electrically connected to the power supply, the control panel and the first pump main body are electrically connected to the first hot-swap pump.

3. The cooling apparatus according to claim 2, further comprising: a second hot-swap pump arranged in parallel with the first hot-swap pump, the second hot-swap pump comprising a second pump main body, a second inlet anti-leakage pipe and a second outlet anti-leakage pipe, the second inlet anti-leakage pipe and the second outlet anti-leakage pipe communicating with the second pump main body, and the second pump main body is electrically connected to the power supply.

4. The cooling apparatus according to claim 3, further comprising: a first branch pipe box, the first outlet anti-leakage pipe and the second outlet anti-leakage pipe are connected to the first branch pipe box, and the first branch pipe box is connected to the internal outlet pipe.

5. The cooling apparatus according to claim 4, further comprising: a second branch pipe box, the first inlet anti-leakage pipe and the second inlet anti-leakage pipe are connected to the second branch pipe box, and the second branch pipe box is connected to the internal outlet opening.

6. The cooling apparatus according to claim 5, further comprising: a water tank and a connecting pipe, the water tank is connected to the second branch pipe box via the connecting pipe.

7. The cooling apparatus according to claim 3, wherein the first outlet anti-leakage pipe comprises a first outlet non-return valve, and the second outlet anti-leakage pipe comprises a second outlet non-return valve.

8. The cooling apparatus according to claim 3, wherein the second hot-swap pump further comprises a second hot-swap connector electrically connected to the second pump main body.

9. The cooling apparatus according to claim 1, further comprising: a chassis, the heat exchanger and the first hot-swap pump are arranged inside the chassis.

10. The cooling apparatus according to claim 9, wherein the chassis comprises a guiding block and a pair of guiding tracks, the first pump main body comprises a guiding slot arranged corresponding to the guiding block and positioned with each other, and the first pump main body enters the chassis along the pair of guiding tracks to be engaged with the first inlet anti-leakage pipe and he first outlet anti-leakage pipe.

11. The cooling apparatus according to claim 9, wherein the chassis comprises a protruding plate, the first hot-swap pump further comprises a first pump outer casing receiving the first pump main body, the first pump outer casing comprises a press elastic slab and is pivotally attached to a handle, the handle comprises a locking slot, the handle is configured to be rotated outward and to be folded relative to the chassis, and when the handle is rotated outward, the press elastic slab is pressed by the handle, and when the handle is folded at an outer side of the first pump outer casing, the locking slot of the handle is locked with the protruding plate of the chassis.

* * * * *